(12) United States Patent
Stingu et al.

(10) Patent No.: US 11,159,056 B2
(45) Date of Patent: Oct. 26, 2021

(54) WIRELESS POWER RECEIVER CIRCUIT AND METHOD

(71) Applicant: Spark Connected LLC, Dallas, TX (US)

(72) Inventors: Petru Emanuel Stingu, Dallas, TX (US); Kenneth Moore, Dallas, TX (US); Yulong Hou, Farmers Branch, TX (US); Ruwanga Dassanayake, Dallas, TX (US)

(73) Assignee: Spark Connected LLC, Dallas, TX (US)

( * ) Notice: Subject to any disclaimer, the term of this patent is extended or adjusted under 35 U.S.C. 154(b) by 0 days.

(21) Appl. No.: 17/020,326

(22) Filed: Sep. 14, 2020

(65) Prior Publication Data

US 2021/0083518 A1   Mar. 18, 2021

Related U.S. Application Data

(60) Provisional application No. 62/899,607, filed on Sep. 12, 2019.

(51) Int. Cl.
*H02J 50/12* (2016.01)
*H02M 3/158* (2006.01)
(Continued)

(52) U.S. Cl.
CPC .............. *H02J 50/12* (2016.02); *A47B 21/06* (2013.01); *G01R 33/0094* (2013.01); *G01R 33/0206* (2013.01); *G01R 33/07* (2013.01); *G01R 33/10* (2013.01); *G06F 1/189* (2013.01); *H02J 50/005* (2020.01); *H02J 50/10* (2016.02);
(Continued)

(58) Field of Classification Search
CPC .. H02J 50/12; H02J 50/80; H02J 50/10; H02J 50/60; H02J 50/005; H02J 50/00; A47B 21/06; A47B 2021/066; A47B 2200/008; G01R 33/0094; G01R 33/0206; G01R 33/07; G01R 33/10; G01R 33/00; G01R 33/02; G06F 1/189; G06F 1/18; H02M 3/1582; H02M 3/158
See application file for complete search history.

(56) References Cited

U.S. PATENT DOCUMENTS

| | | |
|---|---|---|
| 3,376,578 A | 4/1968 | Sawyer |
| 3,735,231 A | 5/1973 | Sawyer |

(Continued)

OTHER PUBLICATIONS

Consumer Reports, "Wireless charging pad review We tested four popular pads to see whether they really make your life easier", Wireless Charging Pad Reviews, Dec. 11, 2013, 5 pages.

(Continued)

*Primary Examiner* — Robert L Deberadinis
(74) *Attorney, Agent, or Firm* — Slater Matsil, LLP (57) ABSTRACT

In an embodiment, a method for providing power to a load using a wireless power receiver includes: wirelessly receiving power using an LC tank; rectifying a voltage of the LC tank using a rectifier; setting a switched-mode power supply coupled between the rectifier and the load in bypass mode; after setting the switched-mode power supply in bypass mode, providing power to the load without switching transistors of the switched-mode power supply; and when wireless power reception is interrupted, providing power to the load by switching one or more transistors of the switched-mode power supply.

21 Claims, 9 Drawing Sheets

(51) Int. Cl.

| | | |
|---|---|---|
| *H02J 50/00* | (2016.01) | |
| *G06F 1/18* | (2006.01) | |
| *G01R 33/00* | (2006.01) | |
| *G01R 33/02* | (2006.01) | |
| *H02J 50/80* | (2016.01) | |
| *H02J 50/10* | (2016.01) | |
| *A47B 21/06* | (2006.01) | |
| *H02J 50/60* | (2016.01) | |
| *G01R 33/07* | (2006.01) | |
| *G01R 33/10* | (2006.01) | |

(52) U.S. Cl.
CPC .............. *H02J 50/60* (2016.02); *H02J 50/80* (2016.02); *H02M 3/1582* (2013.01); *A47B 2021/066* (2013.01); *A47B 2200/008* (2013.01)

(56) References Cited

U.S. PATENT DOCUMENTS

| | | |
|---|---|---|
| 4,860,183 A | 8/1989 | Maeda et al. |
| 5,434,504 A | 7/1995 | Hollis et al. |
| 5,498,948 A | 3/1996 | Bruni et al. |
| 6,175,169 B1 | 1/2001 | Hollis, Jr. et al. |
| 6,184,651 B1 | 2/2001 | Fernandez et al. |
| 6,445,093 B1 | 9/2002 | Binnard |
| 6,803,744 B1 | 10/2004 | Sabo |
| 6,949,845 B2 | 9/2005 | Oisugi et al. |
| 8,049,370 B2 | 11/2011 | Azancot et al. |
| 8,193,769 B2 | 6/2012 | Azancot et al. |
| 8,957,549 B2 | 2/2015 | Kesler et al. |
| 9,590,444 B2 | 3/2017 | Walley et al. |
| 9,800,191 B2 | 10/2017 | Barsilai et al. |
| 9,853,441 B2 | 12/2017 | Teggatz et al. |
| 10,054,622 B2 | 8/2018 | Hernandez et al. |
| 10,079,090 B2 | 9/2018 | Teggatz et al. |
| 10,168,443 B2 | 1/2019 | Mangano et al. |
| 2006/0061323 A1 | 3/2006 | Cheng et al. |
| 2010/0181841 A1 | 7/2010 | Azancot et al. |
| 2010/0219183 A1 | 9/2010 | Azancot et al. |
| 2010/0244579 A1 | 9/2010 | Sogabe et al. |
| 2011/0050164 A1 | 3/2011 | Partovi et al. |
| 2011/0062793 A1 | 3/2011 | Azancot et al. |
| 2011/0074344 A1 | 3/2011 | Park et al. |
| 2011/0121660 A1 | 5/2011 | Azancot et al. |
| 2011/0227527 A1 | 9/2011 | Zhu et al. |
| 2012/0032632 A1 | 2/2012 | Soar |
| 2013/0049484 A1 | 2/2013 | Weissentern et al. |
| 2013/0082651 A1 | 4/2013 | Park et al. |
| 2013/0257172 A1 | 10/2013 | Teggatz et al. |
| 2013/0264973 A1 | 10/2013 | Garg et al. |
| 2013/0285601 A1 | 10/2013 | Sookprasong et al. |
| 2013/0300204 A1 | 11/2013 | Partovi |
| 2014/0080409 A1 | 3/2014 | Frankland et al. |
| 2014/0184150 A1 | 7/2014 | Walley |
| 2015/0115877 A1 | 4/2015 | Arai et al. |
| 2015/0142348 A1 | 5/2015 | Huang et al. |
| 2015/0249484 A1 | 9/2015 | Mach et al. |
| 2015/0341087 A1 | 11/2015 | Moore et al. |
| 2016/0149440 A1 | 5/2016 | Staring et al. |
| 2017/0163100 A1 | 6/2017 | Vocke et al. |
| 2019/0109498 A1 | 4/2019 | Stingu et al. |
| 2019/0190320 A1 | 6/2019 | Park |
| 2019/0319494 A1 | 10/2019 | Park et al. |
| 2019/0334388 A1 | 10/2019 | Van Wageningen et al. |

OTHER PUBLICATIONS

Digi-Key Electronics, "Inductive Versus Resonant Wireless Charging: A Truce May Be a Designer's Best Choice", Aug. 2, 2016, 8 pages.

Gao, Xiang, "Demodulating Communication Signals of Qi-Compliant Low-Power Wireless Charger Using MC56F8006 DSC", NXP Freescale Semiconductor Application Note, Document No. AN4701, Rev. 0, Mar. 2013, 21 pages.

Jansen, J. W., et al., "Overview of analytical models for the design of linear and planar motors", TU/e Eindhoven University of Technology, DOI: 10.1109/TMAG/2014.2328556, Jan. 1, 2014, 8 pages.

Johns, Bill et al., "Adapting Qi-compliant wireless-power solutions to low-power wearable products", Texas Instruments, High-Performance Analog Products, 2Q, 2014, Analog Applications Journal, 7 pages.

Kot, Thomas, "LC Sensor Rotation Detection with MSP430 Extended Scan Interface (ESI)", Texas Instruments, Application Report, SLAA639, Jul. 2014, 33 pages.

Lynch, Brian T., "Under the Hood of a DC/DC Boost Converter", Texas Instruments, Texas Instruments, Power Supply Design Seminar, Paper SEM1800, Dallas, TX, USA, 2008-2009, 26 pages.

Rice, John, "Examining Wireless Power Transfer", Texas Instruments, 2014/2015 Power Supply Design Seminar, 38 pages.

Texas Instruments "Industry-Leading Wireless Power Solutions—The Most Widely Adopted in the Market", ti.com/wirelesspower, SLYT485C, 3 pages.

Texas Instruments, "Introduction to Wireless Power", QI WPG 1.1 compliant, www.ti.com/wirelesspower, 49 pages.

Waters, Benjamin et al., "Optimal Coil Size Ratios for Wireless Power Transfer Applications", IEEE International Symposium on Circuits and Systems (ISCAS), Jun. 1-5, 2014, 4 pages.

Wikipedia, "Electromagnetic coil", https://en.wikipedia.org/w/index.php?title=Electromagnetic_coil&oldid=776415501, Apr. 2017, 6 pages.

Wikipedia, "Inductive charging", https://en.wikipedia.org/w/index.php?title=lnductive_charging&oldid=802615270, Sep. 2017, 7 pages.

Wikipedia, "Qi (standard)", https://en.wikipedia.org/w/index.php?title=Qi_(standard)&oldid=803427516, Oct. 2017, 5 pages.

ZENS, "ZENS First Worldwide to Introduce Built-in Wireless (Sub-)Surface Charger with Apple and Samsung Fast Charge", Jan. 24, 2019, 5 pages.

PRIOR ART

WIRELESS POWER RECEIVER CIRCUIT AND METHOD

CROSS-REFERENCE TO RELATED APPLICATIONS

This application claims the benefit of U.S. Provisional Application No. 62/899,607, entitled "Wireless Charging Circuit and Method," and filed on Sep. 12, 2019, which application is hereby incorporated herein by reference.

This application is filed concurrently with U.S. patent application Ser. No. 17/020,546, U.S. patent application Ser. No. 17/020,546, and U.S. patent application Ser. No. 17/020,494, each of which claim the benefit of U.S. Provisional Application No. 62/899,607, which applications are hereby incorporated herein by reference.

TECHNICAL FIELD

The present disclosure relates generally to an electronic system and method, and, in particular embodiments, to a wireless power receiver circuit and method.

BACKGROUND

Wireless charging systems are becoming ubiquitous in today's society. For example, many smartphones and wearables implement wireless charging technology. Ease of use, greater reliability, spatial freedom, reduced connectors and openings, and the possibility of hermetically sealing are among the benefits offered by wireless charging. Wireless charging standards allow for interoperability between different devices and manufacturers. Some wireless charging standards, such as the Qi standard from the Wireless Power Consortium, are becoming widely adopted. The Qi standard uses inductive charging operating between 80 kHz and 300 kHz to wirelessly transmit power from a transmitter to a receiver. Standards promoted by the AirFuel alliance use resonant wireless charging operating at 6.78 MHz to wirelessly transmit power from a transmitter to a receiver.

Figure 1:
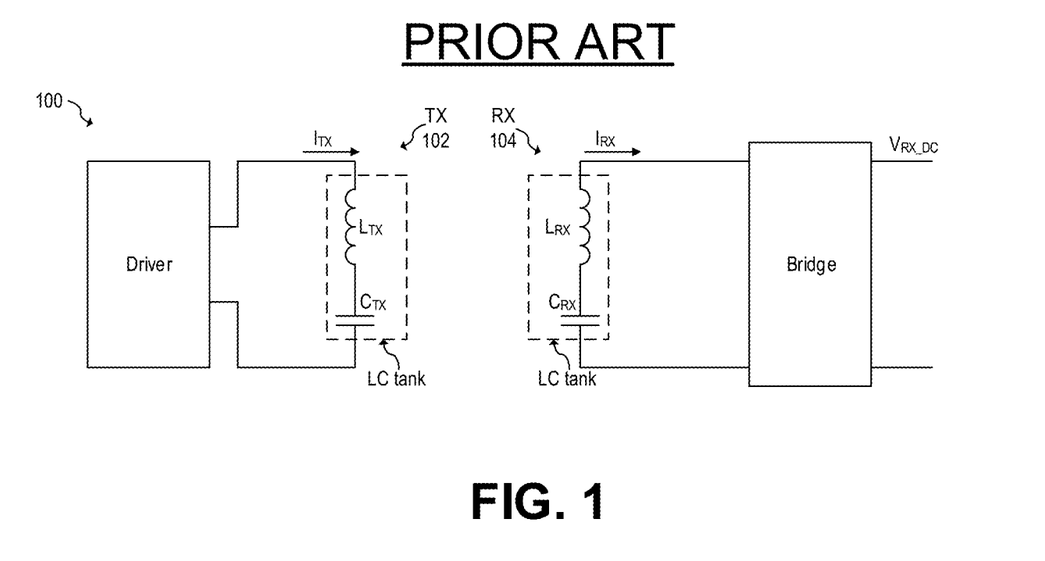
FIG. 1 shows an exemplary wireless charging system.

FIG. 1 shows exemplary wireless charging system 100. Wireless charging system wo includes a transmitter (TX) device 102 that includes a transmitter coil $L_{TX}$, and a receiver (RX) device 104 that includes a receiver coil $L_{RX}$. The efficiency of the wireless power transmission generally depends on the coupling between the coil $L_{TX}$ and coil $L_{RX}$. The coupling between the coil $L_{TX}$ and coil is generally based on the relative position between the coil $L_{TX}$ and coil $L_{RX}$.

SUMMARY

In accordance with an embodiment, a method for providing power to a load using a wireless power receiver includes: wirelessly receiving power using an LC tank; rectifying a voltage of the LC tank using a rectifier; setting a switched-mode power supply coupled between the rectifier and the load in bypass mode; after setting the switched-mode power supply in bypass mode, providing power to the load without switching transistors of the switched-mode power supply; and when wireless power reception is interrupted, providing power to the load by switching one or more transistors of the switched-mode power supply.

In accordance with an embodiment, a wireless power receiver includes: an LC tank configured to receive wireless power; a rectifier having an input coupled to the LC tank; a filtering capacitor coupled to an output of the rectifier; a switching converter coupled between the filtering capacitor and an output terminal; and a controller configured to: set the switching converter in bypass mode to provide power to the output terminal from the rectifier without switching transistors of the switching converter, and when wireless power reception is interrupted, provide power to the output terminal with the switching converter by switching one or more transistors of the switching converter.

In accordance with an embodiment, a wireless power receiver includes: an LC tank configured to receive wireless power; a rectifier having an input coupled to the LC tank; a filtering capacitor coupled to an output of the rectifier; a switching converter coupled between the filtering capacitor and an output terminal; and a controller configured to: after the LC tank receives a ping, increase an effective capacitance of the filtering capacitor.

BRIEF DESCRIPTION OF THE DRAWINGS

For a more complete understanding of the present invention, and the advantages thereof, reference is now made to the following descriptions taken in conjunction with the accompanying drawings, in which.

Corresponding numerals and symbols in different figures generally refer to corresponding parts unless otherwise indicated. The figures are drawn to clearly illustrate the relevant aspects of the preferred embodiments and are not necessarily drawn to scale.

DETAILED DESCRIPTION OF ILLUSTRATIVE EMBODIMENTS

The making and using of the embodiments disclosed are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The description below illustrates the various specific details to provide an in-depth understanding of several example embodiments according to the description. The embodiments may be obtained without one or more of the specific details, or with other methods, components, materials and the like. In other cases, known structures, materials or operations are not shown or described in detail so as not to obscure the different aspects of the embodiments. References to "an embodiment" in this description indicate that a particular configuration, structure or feature described in relation to the embodiment is included in at least one embodiment. Consequently, phrases such as "in one embodiment" that may appear at different points of the present description do not necessarily refer exactly to the same embodiment. Furthermore, specific formations, structures or features may be combined in any appropriate manner in one or more embodiments.

Embodiments of the present invention will be described in a specific context, a wireless power receiver, e.g., compliant with a Qi standard (e.g., versions 1.0, 1.1, 1.2, 1.2.3, and 1.2.4, for example). Embodiments of the present invention may be used in other types of application, such as with wireless power transmission that does not comply with the Qi standard.

It is understood that the term wireless charging is not limited to the charging of a battery, but includes wireless power transmission generally, unless stated otherwise.

In an embodiment of the present invention, a wireless power receiver provides uninterrupted power to a load during temporary interruptions of received power. In some embodiments, a switched-mode power supply (SMPS) is used to transfer charge from a storage or filtering capacitor to a load during the temporary interruptions of wireless power transmission. In some embodiments, the filtering capacitor may be split and controlled such that the effective capacitance during a ping process (analog or digital ping) is reduced, e.g., which in some embodiments may advantageously accelerate the startup process. The ping may be performed, e.g., in accordance with the Qi standard, for example.

Figure 2A:
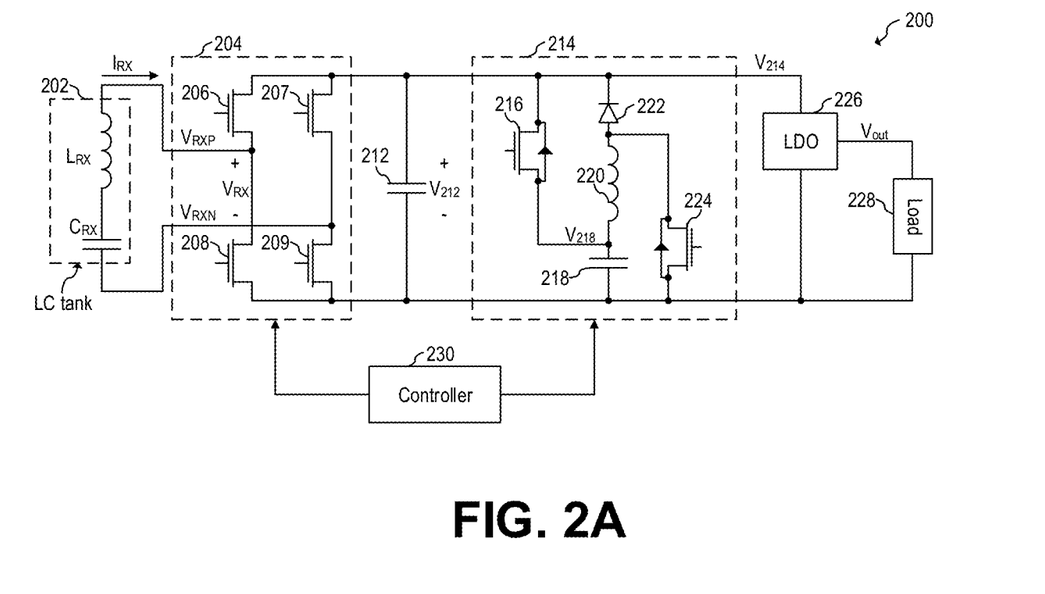
FIG. 2A shows a schematic diagrams of a wireless power receivers, according to an embodiments of the present invention.

FIG. 2A shows a schematic diagram of wireless power receiver 200, according to an embodiment of the present invention. Wireless power receiver 200 includes LC tank 202, current-based synchronous rectifier 204, filtering capacitor 212, switching boost converter 213, regulator 226, and controller 230.

During wireless power transmission (e.g., charging), power is received by LC tank 202 from, e.g., transmitter (TX) device 102. The received power is rectified by current-based synchronous bridge 204, which provides rectification based on the zero-crossing of receiver current $I_{RX}$. Boost converter 214 generates voltage $V_{214}$ from voltage $V_{212}$, and LDO 226 generates output voltage $V_{out}$ from voltage $V_{214}$, and provides the output voltage $V_{out}$ to load 228.

Figure 2B:
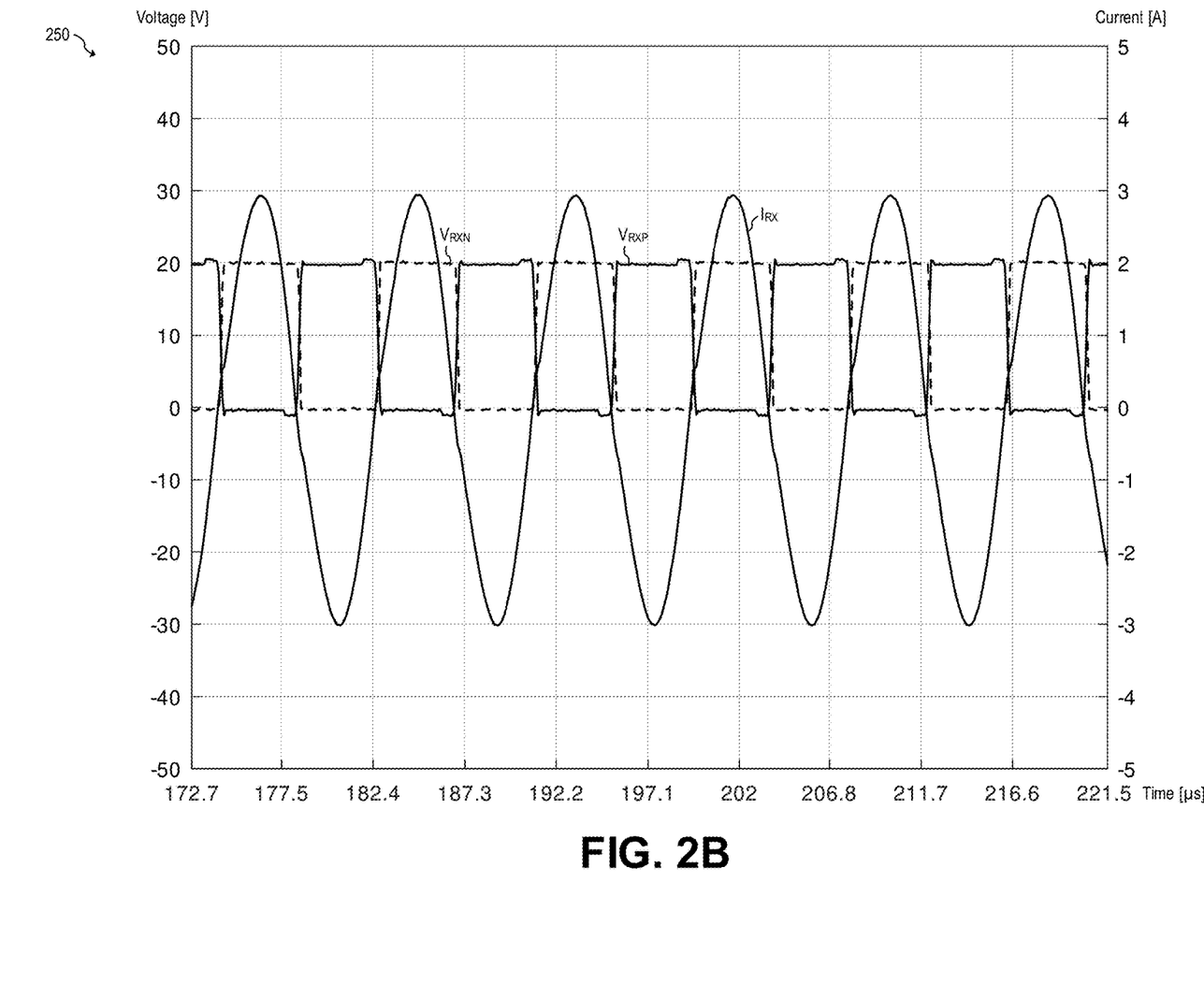
FIG. 2B shows waveforms associated with the LC tank of the wireless power receiver of FIG. 2A during active wireless power transfer, according to an embodiment of the present invention.

FIG. 2B shows waveforms 250 associated with LC tank 108 during active wireless power transfer, according to an embodiment of the present invention.

In some embodiments, wireless power may not be continuously received by boost converter 214 from rectifier 204. For example, in some embodiments, wireless power transfer between a wireless transmitter (e.g., TX 102) and a wireless power receiver (e.g., 200) may be temporarily interrupted, e.g., during a micro-slot or nano-slot (e.g., as explained in co-pending U.S. patent application Ser. No. 17/020,537, associated with, e.g., to perform measurements of characteristics of receiver LC tank 202, such as inductance of $L_{RX}$, quality factor, damping coefficient, voltage across LC tank 202, etc., for, e.g., foreign object detection (FOD)) or when the envelope of voltage $V_{RX}$ decays, e.g., to 0 V (or a low voltage, such as 20% of peak voltage), e.g., periodically following a shape of a rectified (e.g., 60 Hz). During such interruptions in wireless power transmission, some embodiments continue to provide uninterrupted power to load 228, e.g., via LDO 226, by, e.g., boost converter 214 using the charge stored in storage capacitor 218.

For example, in some embodiments, during wireless power transfer, transistor 216 is on and transistor 224 is off, such that boost converter 214 is off. Therefore, the effective filtering capacitance at the output of synchronous rectifier 204 is the capacitance of capacitor 212 plus the capacitance of the capacitor 218 (which combined may be, e.g., 100 µF). For example, in some embodiments, storage capacitor may have capacitance larger (e.g., twice as large, 4 times larger or larger) than the capacitance of capacitor 212. For example, in an embodiment, the capacitances of capacitors 212 and 218 may be 20 µF and µF, respectively. Other capacitance values and relationships between capacitors 212 and 218 are also possible.

When wireless power transfer is interrupted (e.g., a gap in power, e.g., during a micro-slot to make measurements associated to the TX and the RX coils), boost converter 214 begins operating to keep providing power to LDO 226 during such time (e.g., 200 µs) in which no wireless power is being received from the wireless power transmitter (e.g., 102). For example, at the beginning of the micro-slot, transistor 216 turns off and transistor 224 begins switching on and off to transmit power from storage capacitor 218 into LDO 226 via inductance 218.

Since transistor 216 is off during the micro-slot, capacitor 212 operates as an output capacitor for boost converter 214, and boost converter 214 provides power to LDO 226 by transferring charge from storage capacitor 218 to LDO 226 (and to capacitor 212).

By operating boost converter 224 during temporary power interruptions, some embodiments advantageously allow for providing uninterrupted power to load 228 by transferring most of the energy from storage capacitor 218 to load 228, e.g., via LDO 226. For example, in some embodiments, boost converter 224 may continue to transfer energy to the load 228 via LDO 226 when the voltage across capacitor 218 is below 5 V.

LDO 226 may be implemented in any way known in the art, such as by using a regulation transistor to couple voltage $V_{214}$ to voltage $V_{out}$, and an amplifier in a feedback network that senses output voltage $V_O$ and controls the control terminal of the regulation transistor to provide a regulated output voltage $V_{out}$. Other implementations are possible.

In some embodiments, other converters may be used instead of, or in addition to LDO 226. For example, in some embodiments, a switching regulator may be used instead of LDO 226. In some embodiments, voltage $V_{214}$ is provided directly to load 228 without an intervening power converter.

Rectifier 204 may be implemented as a current-based synchronous rectifier, as shown in FIG. 2A. Other implementations are also possible. For example, in some embodiments, rectifier 204 may be implemented asynchronously with, e.g., a diode bridge rectifier.

Load 228 may be, e.g., a custom or general purpose microcontroller, a battery charger, or other electronic circuit, such as other digital, analog, or mixed signal circuit, such as amplifiers, power management circuits, audio circuits, etc. For example, in some embodiments, load 228 is a power converter, e.g., for powering other circuits.

Controller 230 is configured to control the operation of boost converter 214, e.g., by controlling the switching of transistors 216 and 224, during power transfer and during power interruption. Controller 230 may, for example, detect that an interruption or resumption in power transfer is happening, e.g., by sensing voltage $V_{212}$ and/or $V_{RX}$, for example. Controller 230 may also detect that an interruption or resumption in power transfer is happening based on information received, e.g., from TX 102 via in-band or out-of-band communication. Controller 230 may detect the state of power transfer in other ways.

In some embodiments, such as in embodiments implementing rectifier 204 as a synchronous rectifier, controller 230 may also control the operation of synchronous rectifier 204 (e.g., by controlling the switching of transistors 206, 207, 208, and 209). Controller 230 may control synchronous rectifier 204 in any way known in the art.

In some embodiments, controller 230 begins operating boost converter 214 when voltage $V_{212}$ drops below a predetermined threshold. In some embodiments, thus boost converter 214 may advantageously maintain a regulated output voltage $V_{214}$ also when voltage $V_{212}$ drops, such as when synchronous rectifier 204 begins operating asynchronously (with transistors 206, 207, 208 and 209 off, thereby causing a reducing in voltage $V_{212}$ due to the diode drops of transistors 206, 207, 208, and 209) during active wireless power transfer.

Controller 230 may be implemented, e.g., as a general purpose or custom microcontroller including combinatorial logic coupled to a memory. Other implementations are also possible.

Boost converter 214 is configured to transfer energy from storage capacitor 218 to the output of boost converter, e.g., as a regulated voltage $V_{214}$. In some embodiments, other switching converters, such as a buck-boost, buck or flyback converters, as well as capacitive charge-pump/voltage dividers may be used.

Figure 3:
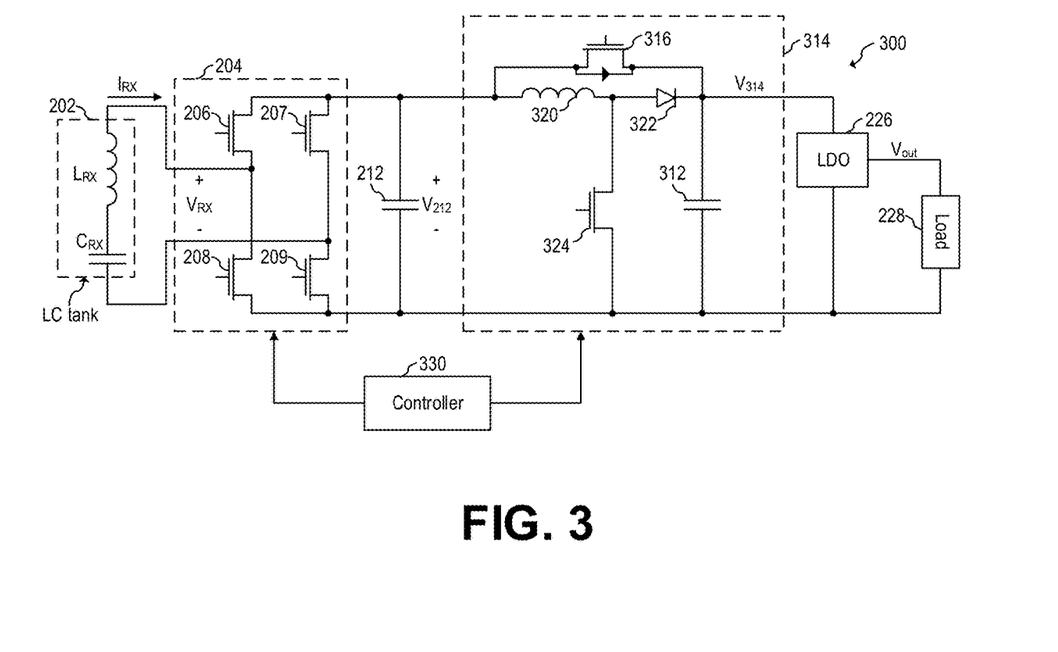
FIGS. 3-5 show schematic diagrams of wireless power receivers, according to embodiments of the present invention.

In some embodiments, a switching converter is used to transfer energy from filtering capacitor 212 to load 228. For example, FIG. 3 shows a schematic diagram of wireless power receiver 300, according to an embodiment of the present invention. Wireless power receiver 300 operates in a similar manner as wireless power receiver 200. Wireless power receiver 300, however, includes boost converter 314 instead of boost converter 214. In the embodiment of FIG. 3, the capacitance of capacitor 212 may be, e.g., wo μF. Other capacitance values may also be used.

Boost converter 314 transfers energy from filtering capacitor 212 to load 228, e.g., via LDO 226, instead of from storage capacitor 218. For example, in some embodiments, during wireless power transfer, transistor 316 is on and transistor 324 is off, such that boost converter 314 is off. When wireless power transfer is interrupted (e.g., a gap in power, e.g., during a micro-slot to make measurements associated to the TX and the RX coils), boost converter 314 begins operating to keep providing power to LDO 226 during such time (e.g., 200 μs) in which, e.g., no wireless power is being received from the wireless power transmitter (e.g., 102). For example, at the beginning of the micro-slot, transistor 316 turns off and transistor 324 begins switching on and off to transmit power from filtering capacitor 212 into LDO 226 via inductance 318.

By operating boost converter 324 during temporary power interruptions, some embodiments advantageously allow for providing uninterrupted power to load 228 by transferring most of the energy from filtering capacitor 212 to load 228, e.g., via LDO 226.

Figure 4:
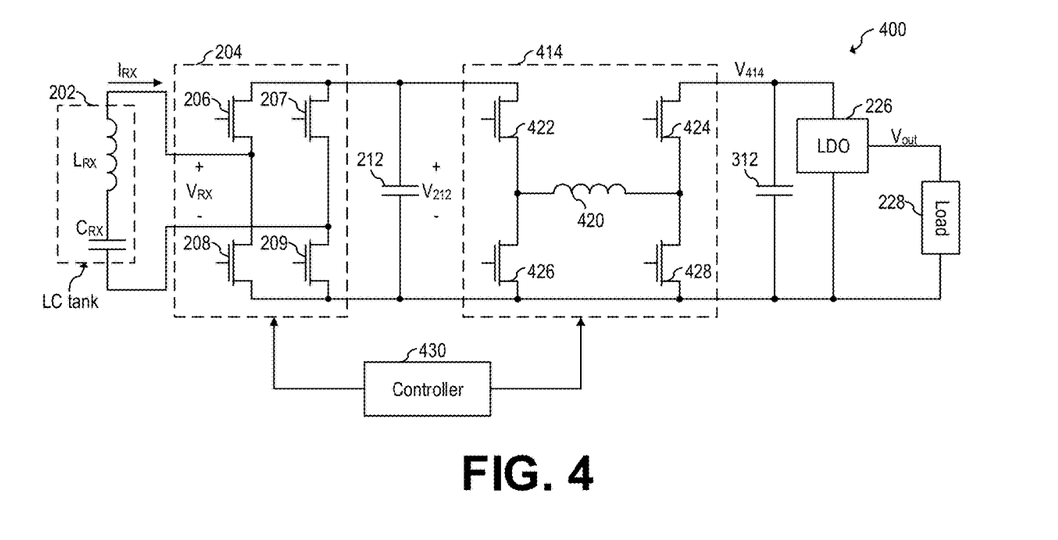

FIG. 4 shows a schematic diagram of wireless power receiver 400, according to an embodiment of the present invention. Wireless power receiver 400 operates in a similar manner as wireless power receiver 300. Wireless power receiver 400, however, includes buck-boost converter 414 instead of boost converter 314.

Similar to boost converter 314, buck-boost converter 414 transfers energy from filtering capacitor 212 to load 228, e.g., via LDO 226. For example, in some embodiments, during wireless power transfer, transistors 422 and 424 are on and transistors 426 and 428 are off, such that buck-boost converter 414 is off. When wireless power transfer is interrupted (e.g., a gap in power, e.g., during a micro-slot to make measurements associated to the TX and the RX coils), buck-boost converter 414 begins operating to keep providing power to LDO 226 during such time (e.g., 200 μs) in which no wireless power is being received from the wireless power transmitter (e.g., 102).

For example, if configured as a buck converter, at the beginning of the micro-slot, transistor 424 turns on, transistor 428 turns off, and transistors 422 and 426 begin switching on and off in a known manner to transmit power from filtering capacitor 212 into LDO 226 via inductance 418. If configured as a boost converter, at the beginning of the micro-slot, transistor 422 turns on, transistor 426 turns off, and transistors 424 and 428 begin switching on and off in a known manner to transmit power from filtering capacitor 212 into LDO 226 via inductance 418.

In some embodiments, using a buck-boost converter (e.g., 414) advatangeously allows for storing additional charge into the filtering capacitor (e.g., 212) without increase the capacitance of filtering capacitor 212, thereby allowing for providing more power to load 228 during temporary interruptions in the wirelessly received power. For example, the energy stored in a capacitor may be given by:

$$E = \frac{1}{2} \cdot C \cdot V^2 \qquad (1)$$

where C is the capacitance of the capacitor and V is the voltage across the capacitor.

In some embodiments, voltage $V_{212}$ may be set higher than the target voltage $V_{414}$, and buck-boost 414 may be used in buck configuration during active wireless power transfer. During an interruption in the wirelessly received power (e.g., during a micro-slot), buck-boost 414 may continue operating as a buck until voltage $V_{212}$ until it cannot maintain the target voltage $V_{414}$, and then operate in boost mode, to continue to transfer charge from capacitor 212 into load 228 while maintaining voltage $V_{414}$ at the target voltage.

Figure 5:
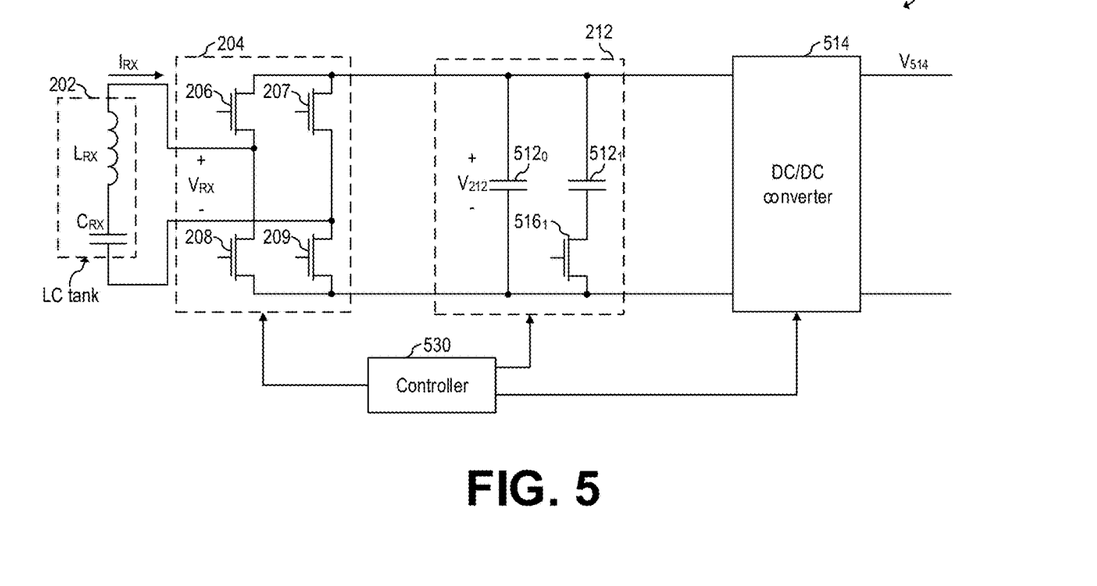

For filtering, filtering capacitor 212 may have a relatively large capacitance, such as 100 μF, or higher. In some embodiments, such as in wireless power receiver 200, 300, or 400, filtering capacitor 212 may be split into a bank of capacitor. For example, FIG. 5 shows a schematic diagram of wireless power receiver 500, according to an embodiment of the present invention. Wireless power receiver 500 operates in a similar manner as any of wireless power receivers 200, 300, or 400, and may implement converter 514 as converters 214, 314, or 414. Wireless power receiver 500, however, implements filtering capacitor 212 with a bank of capacitors. Although FIG. 5 shows filtering capacitor implemented with two capacitors, it is understood that some embodiments may implement the bank of capacitors with M capacitors, where N of the M capacitors are connected in series with respective transistors 516 (e.g., similar to the connection of capacitor $512_1$ and transistor $516_1$) In some embodiments, a single transistor 516 may be shared across multiple or all of the N capacitors. In some embodiments, M is a positive integer greater than or equal to 2, such as 4, 5, or higher, and N is a positive integer greater than or equal to 1 and less than M.

In the embodiment shown in FIG. 5 (with M equal to 2 and N equal to 2), capacitor $512_0$ may have a capacitance that is larger, such as 2 times larger or more than the capacitance of capacitor $512_0$. For example, in some embodiments, the capacitance of capacitor $512_0$ is 80 µF and the capacitor of capacitor $512_1$ is 20 µF.

As another example in which the total capacitance of filtering capacitor 212 is 100 µF, capacitor $512_0$ may be implemented with two 10 µF capacitors, and capacitor $512_1$ may be implemented with eight 10 µF capacitors sharing the same transistor 516 (such that M is equal to 10 and N is equal to 8). Other implementations are also possible. Other values for capacitors $512_0$ and $512_1$, and of total capacitance 212 may also be used.

In some embodiments, a wireless power transmitter generates a ping before wireless power transfer. For example, the wireless power transmitter may generate an analog ping to detect that a wireless power receiver is present in the charging field (the wireless power transmission field). The wireless power transmitter may generate a digital ping to obtain information from the wireless power receiver and adjust one or more charging parameters.

For example, in some embodiments, during the digital ping process, a pulse of energy is generated by the wireless power transmitter (e.g., 102). A wireless power receiver present in the charging field (e.g., such as wireless power receiver 200, 300, 400, or 500) receives the pulse of energy and wirelessly transmits back to the wireless power transmitter (e.g., 102) information related to the amount of power received, such as, for example, information about the voltage across receiver coil $L_{RX}$. Such communication from the wireless power receiver and the wireless power transmitter may be accomplished by using load modulation of a load coupled to receiver coil $L_{RX}$ in ways known in the art.

The digital ping process may be used, for example, to determine whether the wireless power transmitter and the wireless power receiver are compatible to each other, to determine whether it is safe for the wireless power transmitter to begin wirelessly transmitting power, and to determine the amount of power to be transmitted, for example. For example, if during the ping process, the wireless power transmitter determines that the amount of power received by the wireless power receiver is too low, the wireless power transmitter may begin wireless charging at a higher power. If during the ping process, the wireless power transmitter determines that the amount of power received by the wireless power receiver is too high, the wireless power transmitter may begin charging at a lower power or not begin charging.

In some embodiments, the wireless power receiver uses power received from the wireless power transmitter in order to respond to the ping. Since the ping process occurs before wireless power transfer begins, the amount of power transmitted by the wireless power transmitter during the ping process may be small compared to the power transmitted during normal wireless power transfer (even in the lowest setting). As a result, in some embodiments, charging filtering capacitor 212 may take a significant amount of time, thereby causing a slow startup process (e.g., a slow ping process, which delays the detection of the wireless power receiver by the wireless power transmitter and/or delays the configuration of the wireless power transmitter for beginning to wirelessly transfer power).

In an embodiment of the present invention, the effective capacitance of the filtering capacitor is reduced during the ping process. In some embodiments, the filtering capacitor is implemented with a capacitor bank, and only a fraction of the total capacitance of the capacitor bank is enabled during the ping process.

In some embodiments, capacitor 212 may be implemented as the capacitor bank shown in FIG. 5. During the ping process, one or more (or all) of transistors 516 are off, thereby reducing the effective capacitance of capacitor 212. For example, if all transistors 516 are off, the effective capacitance of capacitor 512 during the ping process may be given by the total capacitance of capacitor(s) $512_0$. By reducing the effective capacitance of capacitor 212 (e.g., to 20 µF), the startup time for wireless power transmission may be advantageously reduced.

In some embodiments, after the ping process finishes, all of transistors 516 are turned on (e.g., by controller 530), thereby changing the effective capacitance back to the normal operating value (e.g., 100 µF). By increasing the effective capacitance of filtering capacitor 212 after the ping process, some embodiments advantageously achieve better filtering (e.g., less voltage ripple at the output of the rectifier circuit 204) during normal operation (during wireless power transfer). Therefore, in some embodiments, after the ping process, wireless power receiver 500 operates in a similar manner as wireless power receiver 200, 300, or 400.

In some embodiments, the total capacitance of capacitor(s) $512_0$ is 25% or lower of the total capacitance of capacitor(s) $512_1$.

In some embodiments, the effective capacitance across capacitor 212 (e.g., in wireless power receivers 200, 300, or 400) at the end of a temporary interruption in wirelessly received power may be reduced (e.g., by turning off all or some of transistors 516), e.g., to allow for a faster recovery time for voltage $V_{212}$. In such embodiments, transistors 516 may be turned back on (e.g., one at a time or more than one at a time) once voltage $V_{212}$ reaches a target value.

In some embodiments, charging of capacitor(s) $512_1$ may be performed slowly, e.g., to avoid inrush current (a spike in current) to charge the capacitor(s) $512_1$, which may affect voltage V212. For example, in some embodiments, charging of capacitor(s) $512_1$ may be accomplished, e.g., by using a resistor in parallel with transistor(s) 516. In some embodiments, the resistance is, e.g., a 1 kΩ, to limit the charging current while still allowing the capacitor to charge relatively fast. Other resistance values may be used. In some embodiments, charging of capacitor(s) $512_1$ may be accomplished, e.g., by controlling the on resistance (rdson) of transistor(s) $516_1$.

Figure 6:
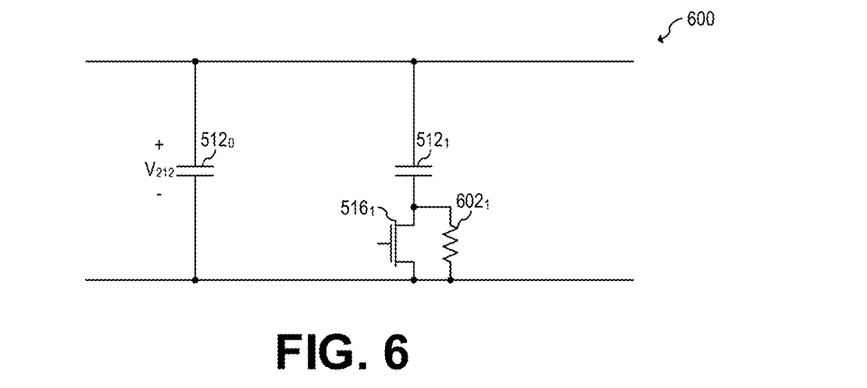
FIG. 6 shows a possible implementation of the capacitor bank of FIG. 5, according to an embodiment of the present invention.

FIG. 6 shows capacitor bank 600, according to an embodiment of the present invention. Capacitor 212 may be implemented as capacitor bank 600.

During a ping process, transistor $516_1$ is off. Since resistor $602_1$ is connected in parallel with the current path of transistor $516_1$, a small amount of current may flow through transistor $602_1$, thereby slowly charging capacitor $512_1$. Since the amount of current allowed to flow through resistor $602_1$ is relatively small (given the relatively large resistance of resistor $602_1$), the effective capacitance of capacitor bank 600 during the ping process is reduced from the full capacitance (when transistor $516_1$ is on). In some embodiments, capacitor bank 600 advantageously allows for reducing the effective capacitance during the ping process and preventing a current spike after the ping process with a simple control scheme (e.g., controller 530 may simply turn on transistor(s) $516_1$ after the ping process).

Figure 7:
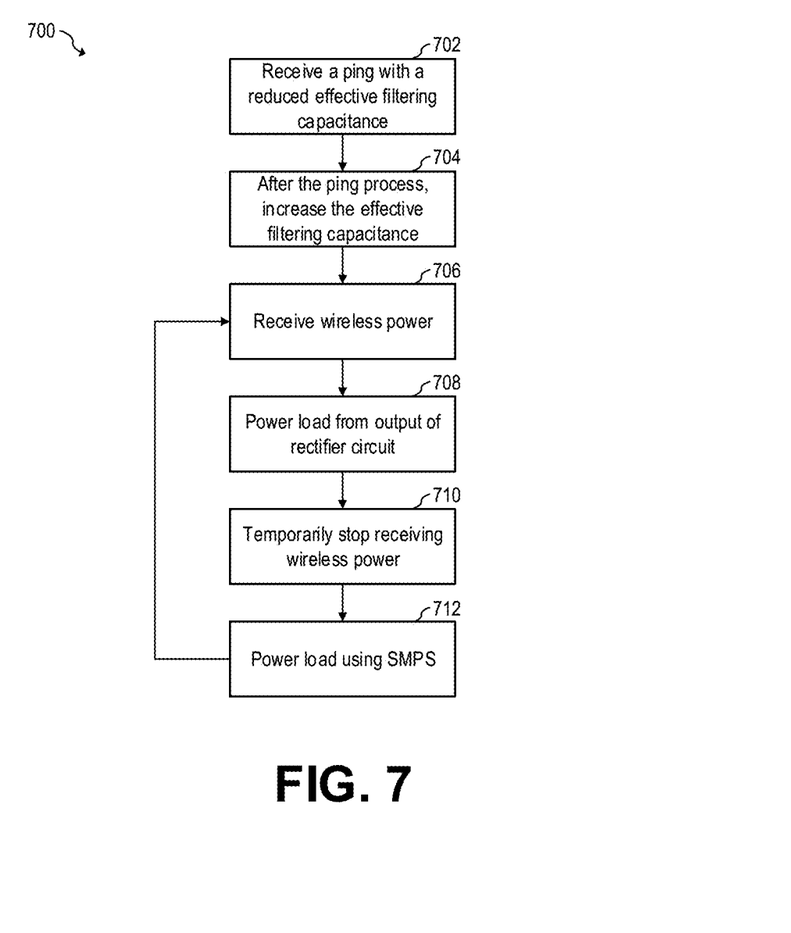
FIG. 7 shows a flow chart of an embodiment method 700 for powering a load using the wireless power receiver of FIG. 5, according to an embodiment of the present invention.

FIG. 7 shows a flow chart of embodiment method 700 for powering a load using wireless power receiver 500, according to an embodiment of the present invention. Wireless power receivers not implementing a way for reducing the effective filtering capacitance of filtering capacitor 212 may implement method 700 by, e.g., skipping steps 702 and 704.

During step 702, a wireless power receiver receives a ping from a wireless power transmitter with a reduced effective filtering capacitance, e.g., to allow for a fast startup time of the ping process and of the wireless power transfer process. For example, the default state of capacitor 212 may be with part of the capacitors of a capacitor bank implementing capacitor 212 being off). During step 702, the wireless power receiver may be fully unpowered (e.g., lack any source of power). In some embodiments, the wireless power receiver may have at least one source of power (e.g., a battery, such as a Li-Ion battery) that powers at least some of the circuits of wireless power receiver (such as the controller and/or load).

During step 704, after the ping process finishes, the effective capacitance of capacitor 212 is increased, e.g., to improve the filtering performance of the filtering capacitor. The increase in effective filtering capacitance of the filtering capacitor may be achieved, e.g., by turning on transistors connected in series with capacitors of a bank of capacitors implemented the filtering capacitor.

During step 706, the wireless power receiver receives wireless power from the wireless power transmitter using an LC tank, e.g., according to the Qi standard. In some embodiments, step 704 is performed in parallel with step 706.

During step 708, a load coupled to the wireless power receiver (e.g., such as load 228) is powered from the rectifier circuit (e.g., 204) without using the SMPS (DC/DC converter 514). For example, when the DC/DC converter is implemented as boost converter 214, transistor 216 is turned fully on and transistor 224 is turned fully off so that boost converter 214 is in bypass mode. When the DC/DC converter is implemented as boost converter 314, transistor 316 is turned fully on and transistor 324 is turned fully off so that boost converter 314 is in bypass mode. When the DC/DC converter is implemented as buck-boost converter 414, transistors 422, 424, 426 and 428 are turned fully off (or transistors 426 and 428 are turned fully off and transistors 422 and 424 are turned fully on) so that buck-boost converter 414 is in bypass mode.

During step 710, a temporary interruption of power received occurs. Such interruption may be, e.g., a micro-slot or nano-slot that may be a duration of, e.g., 200 µs, or lower. In some embodiments, the duration of the interruption may be higher than 200 µs, such as 250 µs, 300 µs, or higher.

During step 712, the load is powered using the SMPS. In other words, the SMPS transitions from bypass mode into operating mode during step 712, and transfers charge to the load from the filtering capacitor and/or a storage capacitor during the temporary interruption in power.

As shown by steps 706 and 710, the temporary interruptions in wireless power received may occur periodically, e.g., from every second, to every minute, or slower. In some embodiments, the temporary interruptions in wireless power received may be caused by changes in temperature, changes in the operating frequency, and changes in other operating points, for example.

FIGS. 8-11 show waveforms associated with wireless power receivers, according to an embodiment of the present invention.

Figure 8:
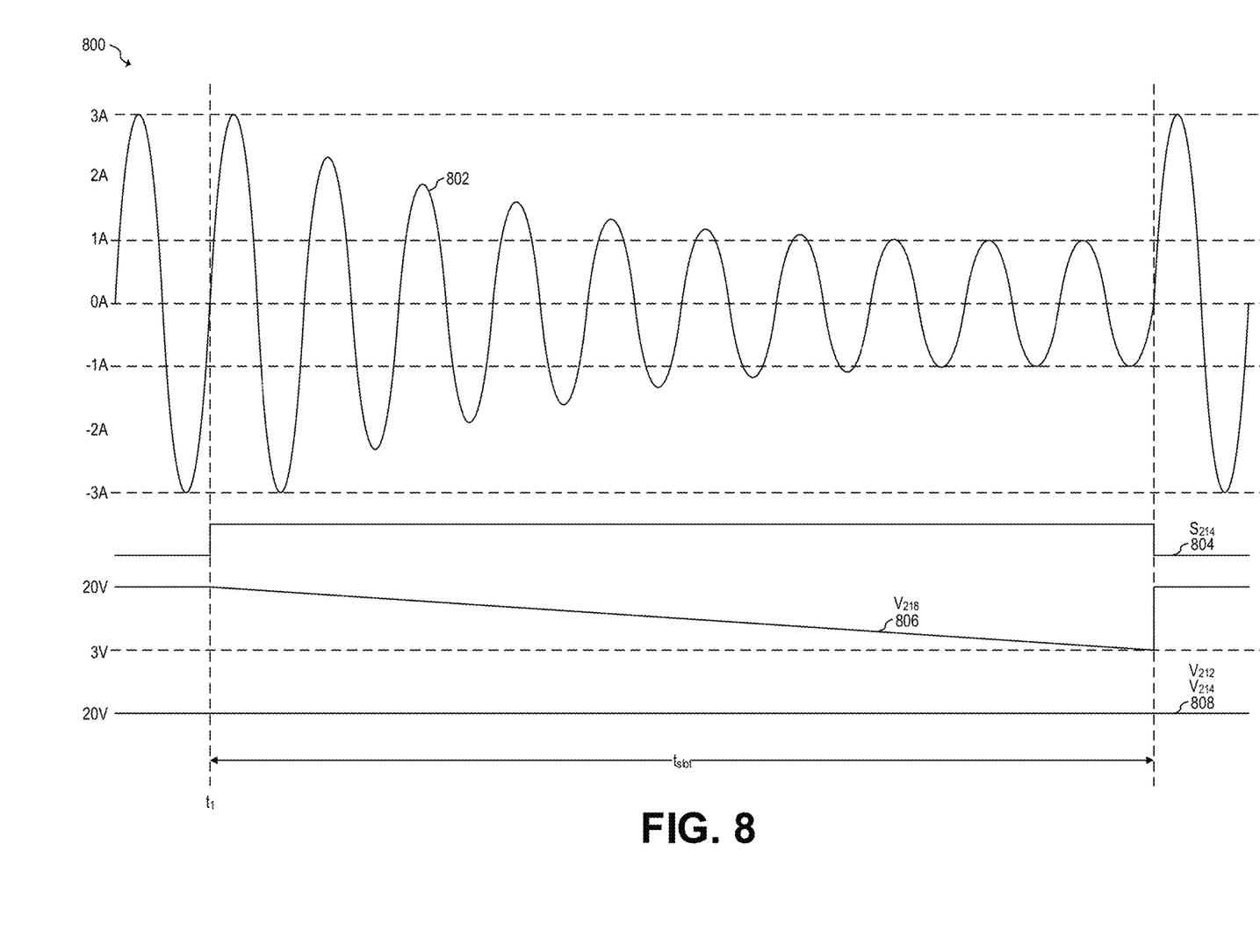
FIGS. 8-11 show waveforms associated with wireless power receivers, according to an embodiment of the present invention.

FIG. 8 shows waveforms 800 associated with wireless power receiver 200, according to an embodiment of the present invention. Waveforms 800 include curve 802 corresponding to current $I_{RX}$, curve 804 corresponding to signal $S_{214}$, where signal $S_{214}$ is indicative of whether boost converter 214 is in active mode or in bypass mode, curve 806 corresponding to voltage $V_{218}$ across storage capacitor 218, and curve 808 corresponding to voltage $V_{212}$ across capacitor 212 (which is also the same as voltage $V_{214}$ at the output of boost converter 214).

As shown by curve 802, when wireless power reception is interrupted at time $t_1$, the peak current of receiver current $I_{RX}$ begins to decrease from, e.g., 3 A to, e.g., 1 A at time $t_2$, where time $t_{slot}$ is, e.g., 100 µs. Boost converter 214 is set to active mode at time $t_1$, as shown by curve 804, and begins to transfer energy from storage capacitor 218 to load 228, as shown by curves 806 and 808. Once wireless power transfer resumes at time $t_2$, boost converter 214 transitions into bypass mode (as shown by curve 804) and capacitor 218 is recharged.

As shown in FIG. 8, by using boost converter 214, some embodiments advantageously maintain the same voltage at voltage $V_{214}$ during the interruption in wireless power transfer by using most of the energy stored in storage capacitor 218. Since voltage $V_{212}$ is also kept at the same level as before the interruption in wireless power transfer measurements performed during time $t_{slot}$ to, e.g., determine quality factor associated with LC tank 108 may not be affected.

Figure 9:
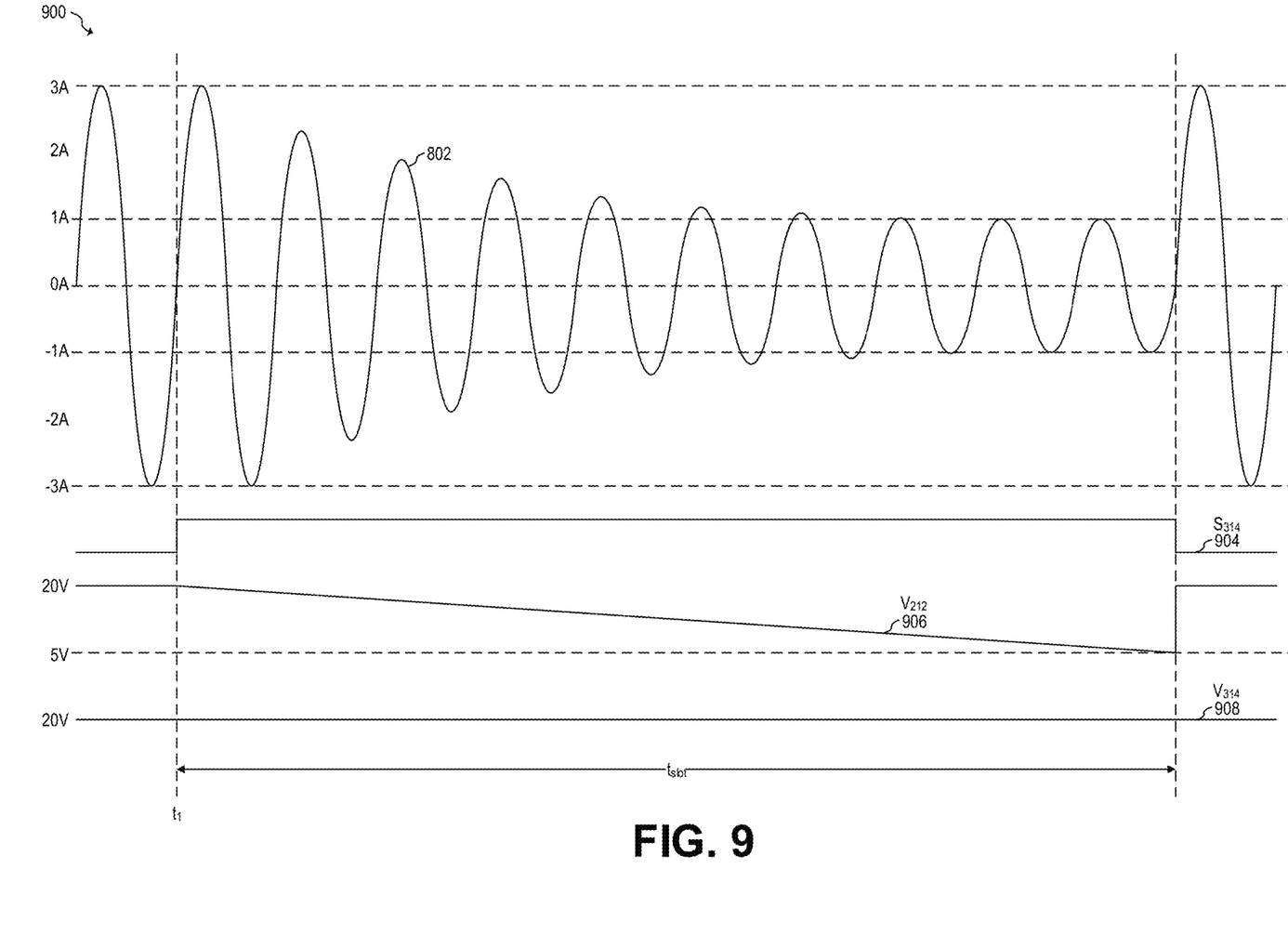

FIG. 9 shows waveforms 900 associated with wireless power receiver 300, according to an embodiment of the present invention. Waveforms 900 include curve 802 corresponding to current $I_{RX}$, curve 904 corresponding to signal $S_{314}$, where signal $S_{314}$ is indicative of whether boost converter 314 is in active mode or in bypass mode, curve 906 corresponding to voltage $V_{212}$ across filtering capacitor 212, and curve 908 corresponding to voltage $V_{314}$ at the output of boost converter 314.

As shown by curve 904, boost converter 314 is set to active mode at time $t_1$, and begins to transfer energy from filtering capacitor 212 to load 228, as shown by curves 906 and 908. Once wireless power transfer resumes at time $t_2$, boost converter 314 transitions into bypass mode (as shown by curve 904) and capacitor 212 is recharged.

As shown in FIG. 8, by using boost converter 214, some embodiments advantageously maintain the same voltage at voltage $V_{214}$ during the interruption in wireless power transfer by using most of the energy stored in storage capacitor 218. Since voltage $V_{212}$ is also kept at the same level as before the interruption in wireless power transfer measurements performed during time $t_{slot}$ to, e.g., determine quality factor associated with LC tank 108 may not be affected.

Figure 10:
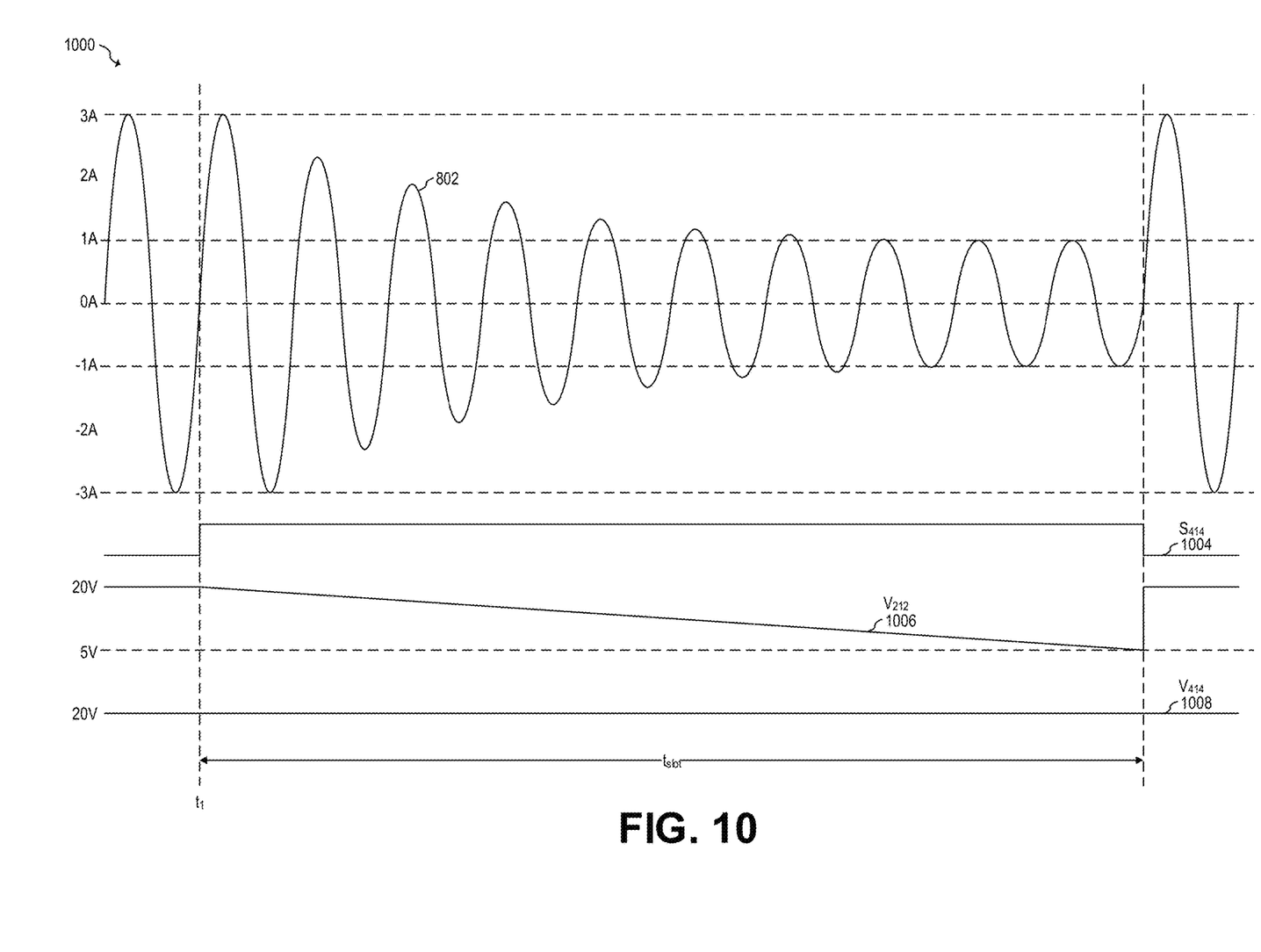

FIG. 10 shows waveforms 1000 associated with wireless power receiver 400, operating either in bypass mode or in boost mode, according to an embodiment of the present invention. Waveforms 1000 include curve 802 corresponding to current $I_{RX}$, curve 1004 corresponding to signal $S_{414}$, where signal $S_{414}$ is indicative of whether buck-boost converter 414 is in boost mode, in buck mode, or in bypass mode, curve 1006 corresponding to voltage $V_{212}$ across filtering capacitor 212, and curve 1008 corresponding to voltage $V_{414}$ at the output of boost converter 414.

As shown in FIG. 10, wireless power receiver 400 may operate in a similar manner as wireless power receiver 300, with buck-boost converter 400 operating in bypass mode during active wireless power transfer, and operating in boost mode during an interruption in the received power by wireless power receiver 400.

Figure 11:
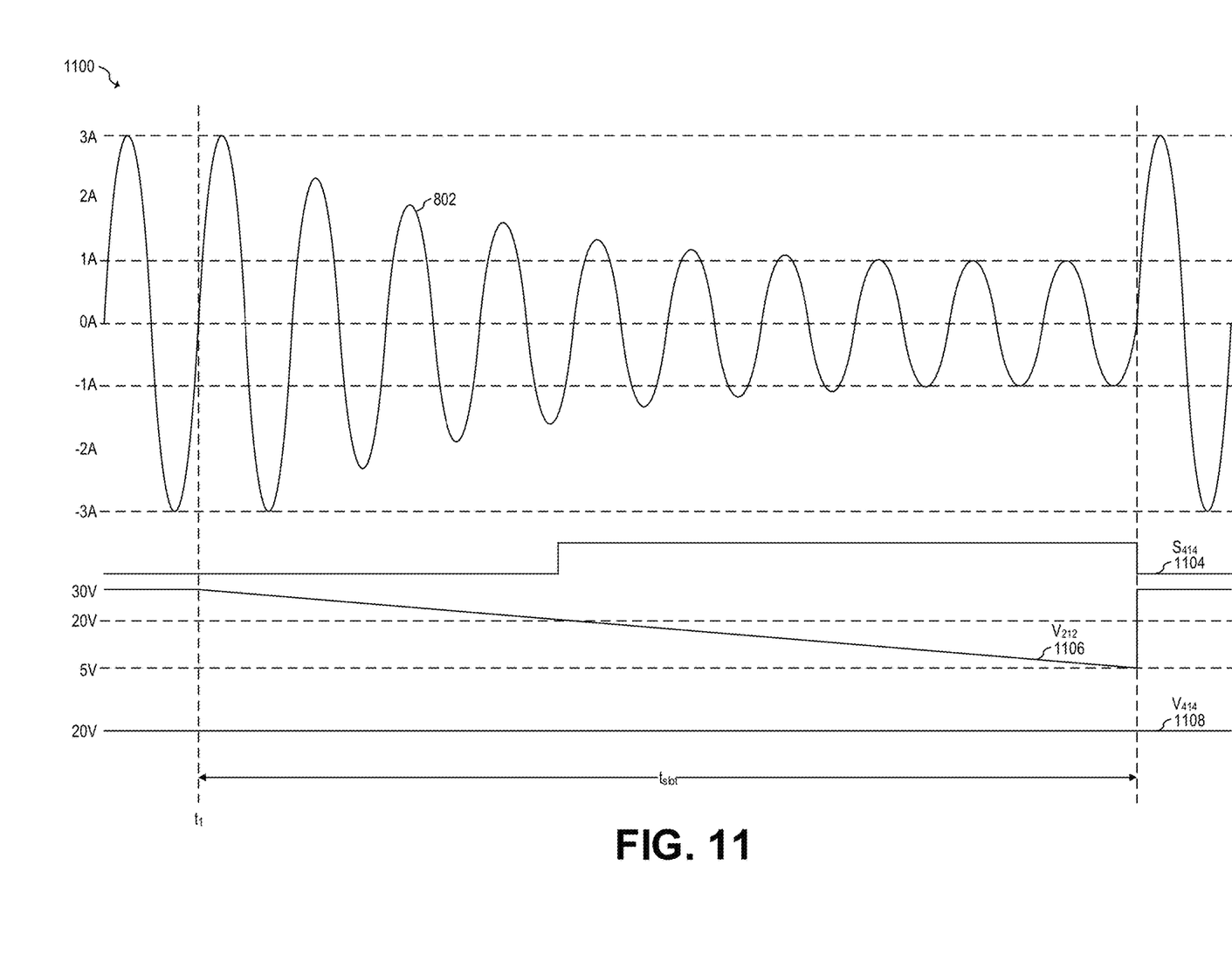

Wireless power receiver 400 may also operate in buck mode, in some embodiments. For example, FIG. 11 shows waveforms 1100 associated with wireless power receiver 400 operating either in buck mode or in boost mode, according to an embodiment of the present invention. Waveforms 1100 include curve 802 corresponding to current $I_{RX}$, curve 1104 corresponding to signal $S_{414}$, where signal $S_{414}$ is indicative of whether buck-boost converter 414 is in boost mode, in buck mode, or in bypass mode, curve 1106 corresponding to voltage $V_{212}$ across filtering capacitor 212, and curve 1108 corresponding to voltage $V_{414}$ at the output of boost converter 414.

As shown by curve 1106, during active wireless power transfer, buck-boost converter 414 operates as a buck to produce 20 V at the output of buck-boost converter 414 from 30 V at the output of rectifier 204. At time $t_1$, buck-boost converter 414 continues operating as a buck converter until the voltage at the output of rectifier 204 reaches 20 V, which causes buck-boost converter 414 to transition into boost mode.

Example embodiments of the present invention are summarized here. Other embodiments can also be understood from the entirety of the specification and the claims filed herein.

Example 1. A method for providing power to a load using a wireless power receiver, the method including: wirelessly receiving power using an LC tank; rectifying a voltage of the LC tank using a rectifier; setting a switched-mode power supply coupled between the rectifier and the load in bypass mode; after setting the switched-mode power supply in bypass mode, providing power to the load without switching transistors of the switched-mode power supply; and when wireless power reception is interrupted, providing power to the load by switching one or more transistors of the switched-mode power supply.

Example 2. The method of example 1, where the interruption in reception of wireless power has a duration of about 200 µs or less.

Example 3. The method of one of examples 1 or 2, further including, performing measurements of characteristics of a coil of the LC tank during the interruption in reception of wireless power.

Example 4. The method of one of examples 1 to 3, where the rectifier is a synchronous rectifier.

Example 5. The method of one of examples 1 to 4, further including: receiving a ping with the LC tank, where a filtering capacitor node that is coupled to an output of the rectifier and to an input of the switched-mode power supply has an effective capacitance equal to a first capacitance; and after receiving the ping, increasing the effective capacitance of the filtering capacitor node from the first capacitance to a second capacitance.

Example 6. The method of one of examples 1 to 5, where the first capacitance is 25% or lower than the second capacitance.

Example 7. The method of one of examples 1 to 6, where the second capacitance is about 100 µF.

Example 8. The method of one of examples 1 to 7, where the filtering capacitor node is coupled to M capacitors that are coupled in parallel, where M is a positive integer greater than 2, where N capacitors of the M capacitors are coupled in series with N respective transistors, where N is a positive integer greater than 1 and lower than M, and where increasing the effective capacitance of the filtering capacitor node includes turning on one or more of the N respective transistors.

Example 9. The method of one of examples 1 to 8, where N resistors are respectively coupled in parallel with the N respective transistors.

Example 10. The method of one of examples 1 to 9, where the switched-mode power supply is a boost converter.

Example 11. The method of one of examples 1 to 10, where the switched-mode power supply includes: an inductor coupled between the rectifier and the load; a diode coupled between the inductor and the load; a first transistor coupled to an intermediate node between the inductor and the diode; a second capacitor coupled to the load; and a second transistor coupled between the rectifier and the second capacitor.

Example 12. The method of one of examples 1 to 11, where setting the switched-mode power supply in bypass mode includes: turning on the second transistor; and turning off the first transistor.

Example 13. The method of one of examples 1 to 12, where providing power to the load by switching transistors of the switched-mode power supply includes: turning off the second transistor; and turning on and off the first transistor.

Example 14. The method of one of examples 1 to 13, where the switched-mode power supply includes: a first transistor coupled to a first intermediate node between the rectifier and the load; a diode coupled to the first intermediate node; an inductor coupled between the diode and the first transistor; a second transistor coupled to a second intermediate node coupled between the inductor and the diode; and a second capacitor coupled between the inductor and the second transistor.

Example 15. The method of one of examples 1 to 14, where setting the switched-mode power supply in bypass mode includes: turning on the first transistor; and turning off the second transistor.

Example 16. The method of one of examples 1 to 15, where providing power to the load by switching transistors of the switched-mode power supply includes: turning off the first transistor; and turning on and off the second transistor.

Example 17. The method of one of examples 1 to 16, where the switched-mode power supply is a buck-boost converter.

Example 18. The method of one of examples 1 to 17, where the switched-mode power supply includes first and second half bridges coupled via an inductor, and where setting a switched-mode power supply in bypass mode includes turning off respective low-side switches of the first and second half-bridges.

Example 19. A wireless power receiver including: an LC tank configured to receive wireless power; a rectifier having an input coupled to the LC tank; a filtering capacitor coupled to an output of the rectifier; a switching converter coupled between the filtering capacitor and an output terminal; and a controller configured to: set the switching converter in bypass mode to provide power to the output terminal from the rectifier without switching transistors of the switching converter, and when wireless power reception is interrupted, provide power to the output terminal with the switching converter by switching one or more transistors of the switching converter.

Example 20. A wireless power receiver including: an LC tank configured to receive wireless power; a rectifier having an input coupled to the LC tank; a filtering capacitor coupled to an output of the rectifier; a switching converter coupled between the filtering capacitor and an output terminal; and a controller configured to: after the LC tank receives a ping, increase an effective capacitance of the filtering capacitor.

Example 21. The wireless power receiver of example 20, where the filtering capacitor including M capacitors coupled in parallel, where M is a positive integer greater than 2, where N capacitors of the M capacitors are coupled in series with N respective transistors, where N is a positive integer greater than 1 and lower than M, and where the controller is configured to increase the effective capacitance of the filtering capacitor by turning on one or more of the N respective transistors.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A method for providing power to a load using a wireless power receiver, the method comprising:
   wirelessly receiving power using an LC tank;
   rectifying a voltage of the LC tank using a rectifier;
   setting a switched-mode power supply coupled between the rectifier and the load in bypass mode;
   after setting the switched-mode power supply in bypass mode, providing power to the load without switching transistors of the switched-mode power supply; and
   when wireless power reception is interrupted, providing power to the load by switching one or more transistors of the switched-mode power supply.

2. The method of claim 1, wherein the interruption in reception of wireless power has a duration of about 200 µs or less.

3. The method of claim 1, further comprising, performing measurements of characteristics of a coil of the LC tank during the interruption in reception of wireless power.

4. The method of claim 1, wherein the rectifier is a synchronous rectifier.

5. The method of claim 1, further comprising:
   receiving a ping with the LC tank, wherein a filtering capacitor node that is coupled to an output of the rectifier and to an input of the switched-mode power supply has an effective capacitance equal to a first capacitance; and
   after receiving the ping, increasing the effective capacitance of the filtering capacitor node from the first capacitance to a second capacitance.

6. The method of claim 5, wherein the first capacitance is 25% or lower than the second capacitance.

7. The method of claim 5, wherein the second capacitance is about 100 µF.

8. The method of claim 5, wherein the filtering capacitor node is coupled to M capacitors that are coupled in parallel, wherein M is a positive integer greater than 2, wherein N capacitors of the M capacitors are coupled in series with N respective transistors, wherein N is a positive integer greater than 1 and lower than M, and wherein increasing the effective capacitance of the filtering capacitor node comprises turning on one or more of the N respective transistors.

9. The method of claim 8, wherein N resistors are respectively coupled in parallel with the N respective transistors.

10. The method of claim 1, wherein the switched-mode power supply is a boost converter.

11. The method of claim 10, wherein the switched-mode power supply comprises:
   an inductor coupled between the rectifier and the load;
   a diode coupled between the inductor and the load;
   a first transistor coupled to an intermediate node between the inductor and the diode;
   a second capacitor coupled to the load; and
   a second transistor coupled between the rectifier and the second capacitor.

12. The method of claim 11, wherein setting the switched-mode power supply in bypass mode comprises:
   turning on the second transistor; and
   turning off the first transistor.

13. The method of claim 11, wherein providing power to the load by switching transistors of the switched-mode power supply comprises:
   turning off the second transistor; and
   turning on and off the first transistor.

14. The method of claim 10, wherein the switched-mode power supply comprises:
   a first transistor coupled to a first intermediate node between the rectifier and the load;
   a diode coupled to the first intermediate node;
   an inductor coupled between the diode and the first transistor;
   a second transistor coupled to a second intermediate node coupled between the inductor and the diode; and
   a second capacitor coupled between the inductor and the second transistor.

15. The method of claim 14, wherein setting the switched-mode power supply in bypass mode comprises:
   turning on the first transistor; and
   turning off the second transistor.

16. The method of claim 14, wherein providing power to the load by switching transistors of the switched-mode power supply comprises:
   turning off the first transistor; and
   turning on and off the second transistor.

17. The method of claim 1, wherein the switched-mode power supply is a buck-boost converter.

18. The method of claim 17, wherein the switched-mode power supply comprises first and second half bridges coupled via an inductor, and wherein setting a switched-mode power supply in bypass mode comprises turning off respective low-side switches of the first and second half-bridges.

19. A wireless power receiver comprising:
   an LC tank configured to receive wireless power;
   a rectifier having an input coupled to the LC tank;
   a filtering capacitor coupled to an output of the rectifier;
   a switching converter coupled between the filtering capacitor and an output terminal; and
   a controller configured to:
      set the switching converter in bypass mode to provide power to the output terminal from the rectifier without switching transistors of the switching converter, and
      when wireless power reception is interrupted, provide power to the output terminal with the switching converter by switching one or more transistors of the switching converter.

20. A wireless power receiver comprising:
   an LC tank configured to receive wireless power;
   a rectifier having an input coupled to the LC tank;
   a filtering capacitor coupled to an output of the rectifier;
   a switching converter coupled between the filtering capacitor and an output terminal; and
   a controller configured to:
      after the LC tank receives a ping, increase an effective capacitance of the filtering capacitor.

21. The wireless power receiver of claim 20, wherein the filtering capacitor comprising M capacitors coupled in parallel, wherein M is a positive integer greater than 2, wherein N capacitors of the M capacitors are coupled in series with N respective transistors, wherein N is a positive integer greater than 1 and lower than M, and wherein the controller is configured to increase the effective capacitance of the filtering capacitor by turning on one or more of the N respective transistors.

* * * * *